(12) United States Patent
Takagi et al.

(10) Patent No.: US 8,098,309 B2
(45) Date of Patent: Jan. 17, 2012

(54) SOLID-STATE IMAGING APPARATUS AND CAMERA USING THE SAME

(75) Inventors: Yuichi Takagi, Kanagawa (JP); Masayoshi Kanazawa, Kanagawa (JP); Kazuhiko Ueda, Kanagawa (JP); Makoto Tsuchimochi, Kanagawa (JP); Shigeo Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 1434 days.

(21) Appl. No.: 10/891,633

(22) Filed: Jul. 15, 2004

(65) Prior Publication Data

US 2004/0263671 A1    Dec. 30, 2004

Related U.S. Application Data

(62) Division of application No. 08/855,637, filed on May 13, 1997, now Pat. No. 6,795,120.

(30) Foreign Application Priority Data

| May 17, 1996 | (JP) | P8-122931 |
| Jun. 17, 1996 | (JP) | P8-155234 |
| Aug. 14, 1996 | (JP) | P8-214438 |
| Aug. 20, 1996 | (JP) | P8-218860 |

(51) Int. Cl.
*H04N 3/14* (2006.01)
*H04N 5/225* (2006.01)
(52) U.S. Cl. .......................... 348/294; 348/374
(58) Field of Classification Search .......... None
See application file for complete search history.

(56) References Cited

U.S. PATENT DOCUMENTS

| 4,445,274 A | 5/1984 | Suzuki |
| 4,760,440 A | 7/1988 | Bigler |
| 4,785,338 A | 11/1988 | Kinoshita |
| (Continued) | | |

FOREIGN PATENT DOCUMENTS

DE    242 308    1/1987
(Continued)

OTHER PUBLICATIONS

European Search Report dated Dec. 28, 2007.

(Continued)

*Primary Examiner* — Luong T Nguyen
(74) *Attorney, Agent, or Firm* — SNR Denton US LLP

(57) ABSTRACT

At least a solid-state imaging device and one or a plurality of bare ICs that are disposed on the back face or on the back face side of the solid-state imaging apparatus and serve as peripheral circuits are provided. The bare ICs are sealed by a resin. A circuit board may be interposed between the solid-state imaging device and the bare ICs, or the solid-state imaging device and the ICs are directly bonded together. According to another aspect, IC chips and other parts as peripheral circuits of a solid-state imaging device are disposed on the inner surface, mainly the ceiling surface, of a light-shielding case. According to a further aspect, a solid-state imaging apparatus for photoelectrically converting, with an imaging device, an image formed by introducing imaging light into the inside of the apparatus is provided with a package having a dark space in itself and accommodating the imaging device in the dark space, and a pinhole for introducing imaging light into the dark space and forming an image of an imaging object on the imaging face of the imaging device.

9 Claims, 16 Drawing Sheets

U.S. PATENT DOCUMENTS

| | | | |
|---|---|---|---|
| 4,896,217 A | | 1/1990 | Miyazawa |
| 5,077,784 A | | 12/1991 | Fujita |
| 5,087,964 A | | 2/1992 | Hatta |
| 5,122,861 A | | 6/1992 | Tamura |
| 5,150,180 A | | 9/1992 | Yama |
| 5,313,367 A | * | 5/1994 | Ishiyama ............... 361/772 |
| 5,337,217 A | | 8/1994 | Tarn |
| 5,423,119 A | | 6/1995 | Yang |
| 5,486,720 A | * | 1/1996 | Kierse ............... 257/659 |
| 5,523,608 A | | 6/1996 | Kitaoka |
| 5,703,397 A | * | 12/1997 | Endo et al. ............... 257/701 |
| 5,748,448 A | * | 5/1998 | Hokari ............... 361/749 |
| 5,763,943 A | | 6/1998 | Baker |
| 5,783,815 A | | 7/1998 | Ikeda |
| 5,811,492 A | * | 9/1998 | Mori et al. ............... 525/92 R |
| 5,940,126 A | | 8/1999 | Kimura |
| 6,028,351 A | * | 2/2000 | Klonis et al. ............... 257/680 |
| 6,692,993 B2 | * | 2/2004 | Li et al. ............... 438/126 |

FOREIGN PATENT DOCUMENTS

| | | |
|---|---|---|
| DE | 43 02 442 | 8/1994 |
| DE | 44 22 216 | 1/1995 |
| EP | 0337692 A2 | 10/1989 |
| EP | 0 425 776 | 5/1991 |
| EP | 0558766 A1 | 9/1993 |
| EP | 0575051 A1 | 12/1993 |
| JP | A63-43353 | 8/1986 |
| JP | 1-154569 | 6/1989 |
| JP | 0 608 932 | 8/1994 |
| WO | WO 93/22788 | 11/1993 |

OTHER PUBLICATIONS

Patent Abstracts of Japan, vol. 9, No. 255, JP60-103681 (NEC Corp.), Jun. 7, 1985.
Patent Abstracts of Japan, vol. 22, No. 309, JP62-102548 (Toshiba Corp.), May 13, 1987.
Patent Abstracts of Japan, vol. 8, No. 66, JP58-216474A (Toshiba Corp.), Dec. 16, 1983.
Patent Abstracts of Japan, vol. 13, No. 38 JP63-236371A (NEC Corp.), Oct. 3, 1998.
Patent Abstracts of Japan, vol. 12, No. 256, JP63-043353A (Olympus Optical Co., Ltd.), Feb. 24, 1988.
European Search Report issued on Jan. 18, 2008 in connection with EP 97 107 881.
European Patent Office Communication dated Aug. 4, 2011 in connection with counterpart EP Application No. 06 014 846.7.

* cited by examiner

SOLID-STATE IMAGING APPARATUS AND CAMERA USING THE SAME

RELATED APPLICATION DATA

This application is a divisional of application Ser. No. 08/855,637, filed May 13, 1997 now U.S. Pat. No. 6,795,120. The present and foregoing applications claim priority to Japanese Application Nos. P08-122931 filed on May 17, 1996; P08-218860 filed on Aug. 20, 1996; P08-155234 filed on Jun. 17, 1996; and P08-214438 filed on Aug. 14, 1996. All of the foregoing applications are incorporated herein by reference to the extent permitted by law.

BACKGROUND OF THE INVENTION

The present invention relates to a solid-state imaging apparatus which introduces light coming from an object into the inside of the apparatus, and photoelectrically converts an image of the object with a solid-state imaging device, as well as a camera using such a solid-state imaging apparatus.

The invention also relates to a camera in which a solid-state imaging device and IC chips and other electronic parts as its peripheral circuits are formed on one surface of a circuit board, and the one surface of the circuit board is covered with a light-shielding case having an opening for allowing light coming from an object to reach the solid-state imaging device, and which camera accommodates a lens for forming an image of the object on the front face of the solid-state imaging device.

Since the solid-state imaging apparatus is required to have superior electrical and optical characteristics, the solid-state imaging device as its heart needs to be incorporated in a special package that is high in mechanical accuracy. Further, the solid-state imaging device requires a very large number of peripheral circuits. For these reasons, conventionally, IC chips and other electronic parts as peripheral circuits are mounted on a printed circuit board that is completely separate from a package accommodating a solid-state imaging device. FIG. 1 is a block diagram showing a general configuration of a solid-state imaging apparatus. In FIG. 1, symbol CCD denotes a CCD solid-state imaging device; S/H, a sample-and-hold circuit; A/D, an A/D converter, DSP, a color signal processing unit; V. DRV, a V driver; TG, a timing generator; RAM, a random access memory connected to the color signal processing unit; and CONT, a microcomputer also connected to the color signal processing unit.

In the case of a digital apparatus, examples of peripheral circuits are a sample-and-hold circuit, a timing generator, a CCD solid-state imaging device clocked driver (what is called a V-driver, for instance), an AGC (auto gain control) circuit, a clock generator (a quartz oscillator, for instance), an A/D converter, a digital camera process circuit, a D/A converter, a composite TV encoder, a digital communication peripheral circuit such as IEEE 1394, FDDI, or a fiber channel, and a DC-DC converter.

In the case of an analog apparatus, examples of peripheral circuits are a sample-and-hold circuit, a timing generator, a CCD solid-state imaging device clocked driver (what is called a V-driver, for instance), an AGC (auto gain control) circuit, a clock generator (a quartz oscillator, for instance), a composite TV encoder, a DC-DC converter, and a camera process circuit, which are part of the above peripheral circuits of a digital apparatus.

FIG. 2 shows the configuration of a conventional solid-state imaging apparatus. In FIG. 2, reference numerals 51-53 denote a CCD solid-state imaging device, a lens unit, and a solid-state-imaging-device-mounting circuit board, respectively. A flexible circuit board 54 connects the solid-state-imaging-device-mounting circuit board 53 to an IC-mounting circuit board 55 made of glass epoxy resin, for instance. Numerals 56 and 57 denote ICs mounted on the circuit board 55 and a pin jack of the circuit board 55, respectively.

The conventional solid-state imaging apparatus shown in FIG. 2 cannot fully satisfy the requirement of miniaturization. Solid-state imaging apparatuses and cameras using those are used for a wide variety of purposes. For example, while the requirement of miniaturization is not so strong in cameras for business use such as a broadcasting purpose, it is very strong in cameras for home use. As the application range expands, the requirement of price reduction becomes more important in addition to the miniaturization.

However, it is difficult to reduce the size of the solid-state imaging apparatus of FIG. 2, because it requires the solid-state-imaging-device-mounting circuit board 53, the IC-mounting circuit board 55, and the flexible circuit board 54 for connecting the circuit boards 53 and 55 and each of those circuit boards occupies a non-negligible area. Further, due to the use of many kinds of circuit boards and a number of operation steps for connecting those circuit boards, the manufacturing cost of the imaging apparatus of FIG. 2 is high and hence there is a limitation in its price reduction.

FIG. 3 shows a conventional camera. In this camera, wiring films 152 are formed on one surface of a circuit board 151, and a solid-state imaging device 153 is mounted on one of those wiring films 152. IC chips 154 as peripheral circuits of the solid-state imaging device 153 are also mounted on the wiring films 152. A lens 155 is mounted on the same surface of the circuit board 151 by means of legs 156 of the lens 155 so as to have a given positional relationship with the solid-state imaging device 153. Further, a light-shielding case 157 for shielding the solid-state imaging device 153 and the IC chips 154 from the external environment is attached to the same surface of the circuit board 151.

Reference numeral 158 denotes an opening (aperture) formed in the light-shielding case 157. Light coming from an object is passed through the opening 158 and then imaged on the front face of the solid-state imaging device 153 by the lens 155. An optical filter 159 closes the opening 158. Further, reference numeral 160 denotes bonding wires; 161, resins formed by potting to seal the IC chips 154; and 162, an adhesive for bonding the leg 156 of the lens 155 to the circuit board 151.

The camera of FIG. 3 cannot fully satisfy the requirement of miniaturization. This is because, as described above, cameras using a solid-state imaging device are used for a wide variety of purposes. For example, while the requirement of miniaturization is not so strong in cameras for business use such as a broadcasting purpose, it is very strong in cameras for home use. Further, the requirement of miniaturization is strong in many of cameras for other purposes such as a monitor camera. On the other hand, cameras using a solid-state imaging device as its heart are required to be of high performance and have many functions and, resultingly, need to incorporate many peripheral circuits. The number of peripheral circuits needed is large particularly in the case of a digital camera.

A conventional solid-state imaging apparatus to be incorporated in an electronic camera or the like has a lens for forming an image of an imaging object.

FIG. 4 is a sectional view showing a conventional solid-state imaging device. A package 201 accommodates an imaging device (CCD) 203 to protect it from the external environment. The package 201 is formed with an opening for introducing imaging light, and the opening is covered with a cover glass 205. Leads 207 for leading out an electrical signal from the imaging device 203 are extended from the package 201. The leads 207 also serve to fix the package 201 to an inner surface of a case 209.

The case 209 is mounted with a lens 211 such that its optical axis is perpendicular to the cover glass 205. The lens 211 forms an image of imaging light coming from an imaging object on the imaging face of the imaging device 203. A lens stop 213, which is provided between the lens 211 and the cover glass 205 in the case 209, limits light coming from the lens 211 to adjust the amount of light reaching the imaging device 203.

The conventional solid-state imaging apparatus 215 having the above configuration can produces an electrical signal by forming an image of imaging light that is taken through the lens 211 on the imaging face of the imaging device 3 and photoelectrically converting the image.

However, in the above conventional solid-state imaging apparatus 215, which forms an image of imaging light by using the lens 211, the lens and the lens stop 213 for light quantity adjustment are needed. This results in disadvantages, i.e., a large number of parts and a complex structure, which are obstacles to miniaturization of the apparatus.

Since the lens 211, the lens stop 213, and the imaging device 203 need to be disposed on the optical axis with high accuracy, the imaging apparatus 215 is poor in ease of assembling. Further, since these parts need to be held so as to be kept highly accurate, it is difficult to handle the imaging apparatus 215.

The above problems are also factors of increasing the manufacturing cost of the imaging apparatus 215.

SUMMARY OF THE INVENTION

The present invention has been made to solve the above problems, and an object of the invention is to reduce the size and the price of a solid-state imaging apparatus and a camera using it.

Another object of the invention is to reduce the size of a camera using a solid-state imaging device even if the camera incorporates a number of peripheral circuits.

A further object of the invention is to provide a solid-state imaging apparatus which has a smaller number of parts and a simple configuration, to thereby reduce the size, make it easier to handle the apparatus, and reduce the manufacturing cost.

According to a first aspect of the invention, there is provided a solid-state imaging apparatus comprising a solid-state imaging device; one or a plurality of bare ICs disposed on a back face or on a back face side of the solid-state imaging device, and serving as a peripheral circuit or circuits of the solid-state imaging device; and a resin for sealing the bare IC or ICs.

With this configuration, it is not necessary to mount the solid-state imaging device and the bare ICs as peripheral circuits on separate circuit boards. Further, a flexible circuit board (which is necessary in the conventional solid-state imaging apparatus shown in FIG. 2) for connecting a solid-state-imaging-device-mounting circuit board to a bare-IC-mounting circuit board is not necessary. Therefore, the size of the solid-state imaging apparatus can be reduced. Further, since it is not necessary to use many kinds of circuit boards and no circuit board for connecting circuit boards is needed, the number of parts used, their costs, and the number of assembling steps can be reduced. Therefore, the price of the solid-state-imaging apparatus can be reduced. In addition, since signal lines can be made shorter than in the conventional case, noise is less likely generated and introduced, whereby the electrical characteristics can be improved.

According to a second aspect of the invention, there is provided a solid-state imaging apparatus comprising a first package having a multilayered wiring structure; a solid-state imaging device mounted on an outer surface side of the first package; and one or a plurality of bare ICs disposed on an inner surface side of the first package and serving as a peripheral circuit or circuits of the solid-state imaging device, the one or plurality of bare ICs being connected to the solid-state imaging device via a multilayered wiring of the first package.

With this configuration, the solid-state imaging device is disposed on one side of the first package having a multilayered wiring structure and the ICs as peripheral circuits are disposed on the other side, and necessary electrical connections between the solid-state imaging device and the ICs can be established by a wiring of the first package. Therefore, the solid-state imaging device and ICs and other parts as peripheral circuits can be mounted at a higher integration density.

In a camera using the solid-state imaging apparatus according to the first or second aspect of the invention as an imaging means that is the heart of the camera, its size and price can necessarily be reduced. In addition, since signal lines can be made shorter than in the conventional case, noise is less likely generated and introduced, whereby the electrical characteristics can be improved.

According to a third aspect of the invention, there is provided a solid-state imaging apparatus comprising a circuit board; a solid-state imaging device mounted on one surface of a circuit board; a light-shielding member covering the one surface of the circuit board, the light-shielding member having an opening for allowing light coming from an object to reach the solid-state imaging device; image forming means for forming an image of the object on a front face of the solid-state imaging device; and an IC chip and/or other electronic parts as peripheral circuits of the solid-state imaging device mounted on an inner surface of the light-shielding member.

With this configuration, since IC chips and/or other electronic parts are also disposed on the inner surface of the light-shielding case, the inside space formed by the circuit board and the light-shielding case can be utilized effectively. Therefore, the camera can be miniaturized even if a number of peripheral circuits are used.

According to a fourth aspect of the invention, there is provided a solid-state imaging apparatus comprising a package structure having a dark space in itself and accommodating a solid-state imaging device in the dark space; and a pinhole for introducing imaging light into the dark space and forming an image of an imaging object on an imaging face of the solid-state imaging device; and the solid-state imaging device for photoelectrically converting the image.

With this configuration, the image formation of imaging light is enabled by the pinhole instead of a lens. Thus, a lens and a lens stop, which is conventionally required to form an image of imaging light, can be eliminated. Therefore, the number of parts can be reduced and hence the apparatus can be made simple in configuration. As a result, the solid-state imaging apparatus can be reduced in size, made easier to handle, and reduced in manufacturing cost.

The package structure may comprise a package having an opening and accommodating the solid-state imaging device; a package cover glass for closing the opening of the package; and a light-shielding member formed with the pinhole and bonded to the package cover glass. With this configuration, the pinhole can be formed by using the member for protecting the imaging device. As a result, the apparatus can be configured by a smaller number of parts and hence can be made simple in configuration.

The package structure may comprise a package; a cover case having an opening and forming the dark space together with the package; a cover glass for closing the opening of the cover case from one of an outside and an inside of the opening; and a light-shielding member formed with the pinhole, for closing the opening of the cover case from the other of the inside and the outside of the opening. With this configuration, the cover glass and the light-shielding member can be formed as separate members. As a result, the degree of freedom in selecting their shapes and materials can be increased.

BRIEF DESCRIPTION OF THE DRAWINGS

FIGS. 9A-9C show steps of a manufacturing method of the third embodiment in which FIGS. 9A and 9B are perspective views and FIG. 9C is a sectional view;

FIGS. 19A and 19B show a camera according to a sixth embodiment of the invention in which FIG. 19A shows a state that a light-shielding case is made upside down and FIG. 19B is a perspective view of the camera;

FIGS. 20A and 20B show a camera according to a seventh embodiment of the invention in which FIG. 20A shows a state that a light-shielding case is made upside down and FIG. 20B is a perspective view of the camera;

DESCRIPTION OF THE PREFERRED EMBODIMENTS

The present invention will be hereinafter described in detail by way of illustrated embodiments.

Embodiment 1

Figure 5:
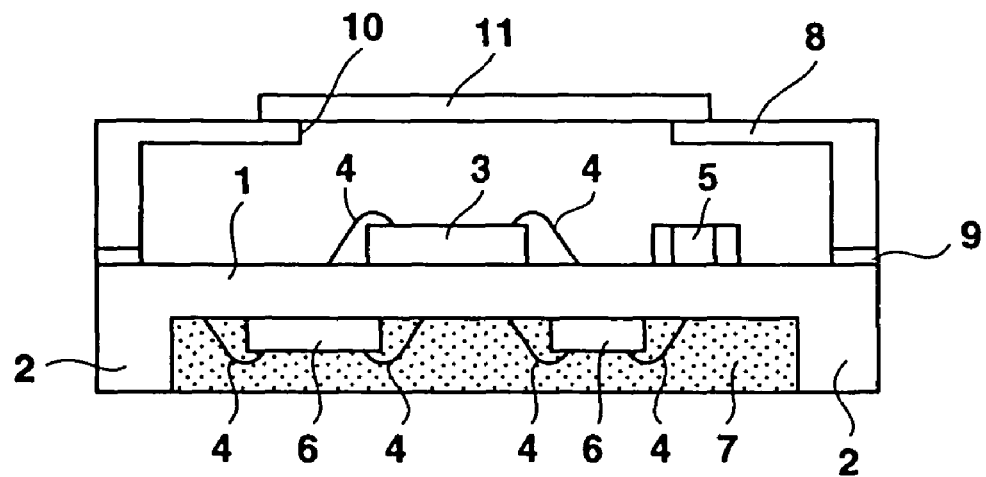
FIG. 5 is a sectional view showing a first embodiment of the present invention.

FIG. 5 shows a first embodiment of the invention. In FIG. 5, a circuit board 1 is a ceramic wiring board, for instance, and a peripheral wall 2 is integral with a peripheral portion of the back surface of the circuit board 1. Reference numeral 3 denotes a CCD solid-state imaging device, for instance, which is mounted on the front surface of the circuit board 1 approximately at its center. Electrodes of the solid-state imaging device 3 are connected to wiring films formed on the front surface of the circuit board 1 via wires 4. In this embodiment, a discrete part 5 is mounted on the front surface of the circuit board 1. Like ICs 6 (described below), the discrete part 5 may be mounted on the back surface of the circuit board 1.

One or a plurality of bare ICs 6 are mounted on the portion of the back surface of the circuit board 1 inside the peripheral wall 2. Electrodes of each bare IC 6 are electrically connected to wiring films formed on the back surface of the circuit board 1 via wires 4. On the back side of the circuit board 1, the inside space of the peripheral wall 2 is charged with a sealing resin 7 by potting, which seals the bare ICs 6. A discrete part 5 may also be mounted on the back side of the circuit board 1 and may be sealed, together with the bare ICs 6, by the sealing resin 7.

A light-shielding case 8, which shields the solid-state imaging device 3, the discrete part 5, and other parts from the external environment, is made of an opaque material and its bottom peripheral end is fixed to a peripheral portion of the front surface of the circuit board 1 with an adhesive 9. A light passage hole 10 is formed in a top central portion of the case 8 is closed by a sealing transparent plate 11.

In this solid-state imaging apparatus, the bare IC 6, the discrete part 5, and other parts constitute peripheral circuits. Specifically, in the case of a digital apparatus, examples of peripheral circuits are a sample-and-hold circuit, a timing generator, a CCD solid-state imaging device clocked driver (what is called a V-driver, for instance), an AGC (auto gain control) circuit, a clock generator (a quartz oscillator, for instance), an A/D converter, a digital camera process circuit, a D/A converter, a composite TV encoder, a digital communication peripheral circuit such as IEEE 1394, FDDI, or a fiber channel, and a DC-DC converter.

In the case of an analog apparatus, examples of peripheral circuits are a sample-and-hold circuit, a timing generator, a CCD solid-state imaging device clocked driver (what is called a V-driver, for instance), an AGC (auto gain control) circuit, a clock generator (a quartz oscillator, for instance), a composite TV encoder, a DC-DC converter, and a camera process circuit, which are part of the above peripheral circuits of a digital apparatus.

In the above solid-state imaging apparatus, the solid-state imaging device 3 and the discrete part 5 as its peripheral circuit are mounted on the front surface of the circuit board 1, i.e., the ceramic wiring board, and the bare ICs 6 as peripheral circuits of the solid-state imaging device 3 are mounted on the back surface of the circuit board 1. The electrical connections among the solid-state imaging device 3, the discrete part 5, and the bare ICs 6 can be made via the wiring films (including wiring films having through-holes) formed on the circuit board 1 itself. Therefore, the ceramic wiring board 1 is the only circuit board constituting the solid-state imaging apparatus and hence the area occupied by the solid-state imaging apparatus can be greatly decreased. As a result, the size of the solid-state imaging apparatus can be reduced and the part price of all the circuit boards can be made much lower than in the conventional case.

Since the electrical connections between the solid-state imaging device 3 and the discrete part 5 and bare ICs 6 as its peripheral circuits can be made by the wiring formed on the circuit board 1 itself, a connection between a flexible circuit board and a solid-state-imaging-device-mounting circuit board and a connection between the flexible circuit board and an IC-mounting circuit board, which are necessary in a conventional apparatus, are no longer necessary. Therefore, the number of assembling steps is greatly reduced, which is another factor of decreasing the price of the solid-state imaging apparatus.

Thus, this embodiment can provide a very small solid-state imaging apparatus at a low price. Further, the signal lines can be made shorter as a whole than in the conventional case, the noise resistance characteristic can be improved.

Embodiment 2

Figure 6:
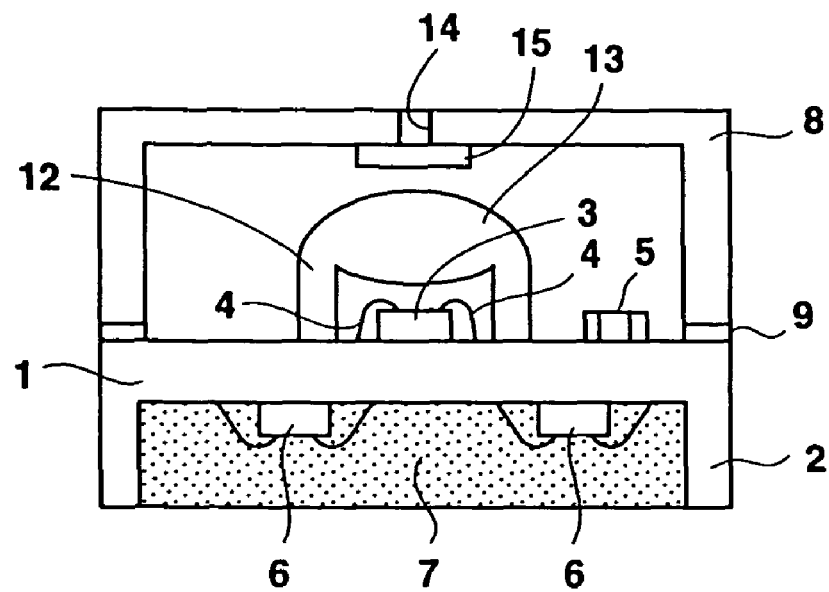
FIG. 6 is a sectional view showing a second embodiment of the invention.

FIG. 6 is a sectional view showing a second embodiment of the invention. The second embodiment is much different from the first embodiment in the following points. The apparatus of this embodiment incorporates a lens 13, and the case 8 has an aperture 14 which is closed by an infrared-cutting filter 15. Because it is not necessary to separately provide a lens, a lens stop, and a filter, the apparatus of this embodiment is a camera. However, this embodiment is the same as the first embodiment in the other points, and redundant descriptions therefor will be omitted; only the different points will be described below.

A lens fixing member (leg) 12 is integral with the lens 13, and its bottom end face is bonded to the front surface of the circuit board 1 at such a position that the lens 13 can image an object onto the surface of the solid-state imaging device 3. While the lens 13 is naturally transparent, it is preferable in terms of prevention of leakage light that the lens fixing member 12 not be transparent (be black, for instance). However, it may be transparent. The make the non-transparent lens fixing member 12 integral with the lens 13, they may be formed separately and then bonded together. Alternatively, they may be formed by two-color molding that uses resin materials of different colors.

The aperture 14 is formed in a top central portion of the case 8, and has a size that provides an aperture value necessary to provide desired characteristics of the camera. The infrared-cutting filter 15 closes the aperture 14.

According to this embodiment, the necessary aperture value can be obtained by the aperture 14 and an image of an object carried by light passed through the aperture 14 can be formed on the surface of the solid-state imaging device 3 by the lens 13. The CCD solid-state imaging device 3 can pick up that image and its output signal can be subjected to signal processing necessary for image reproduction by the bare ICs 6 and the discrete part 5 that are the peripheral circuits of the CCD solid-state imaging device 3. Therefore, it can be said that the apparatus of this embodiment is a camera.

The camera of this embodiment can be constructed so as to have sufficient functions as a camera merely by adding only the lens member to the very small, inexpensive solid-state imaging apparatus of FIG. 5, converting the light-introducing hole of the case 8 into the aperture 14, and closing the aperture 14 by the infrared-cutting filter 15. Thus, an extremely small, inexpensive camera can be provided.

Embodiment 3

Figure 7:
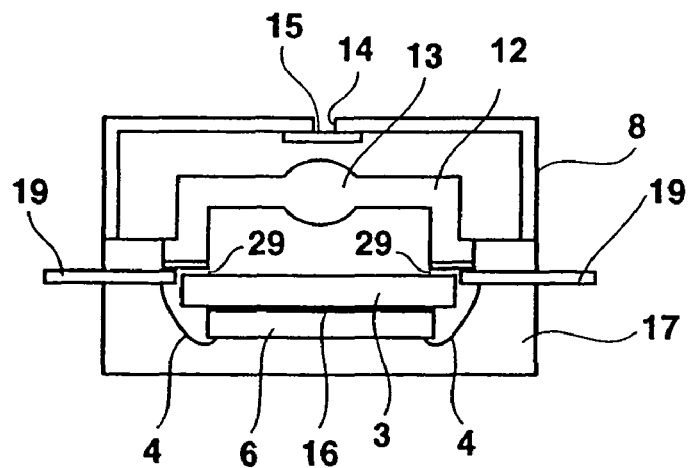
FIG. 7 is a sectional view showing a third embodiment of the invention.
Figure 8A:
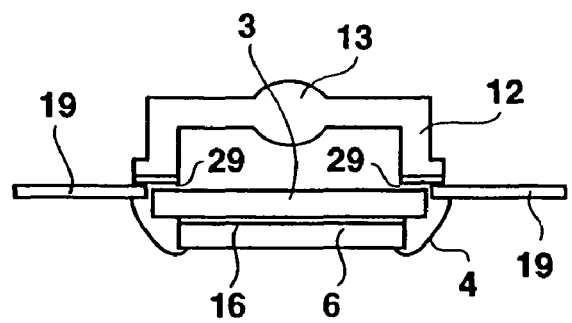
FIGS. 8A and 8B are a sectional view and a bottom view, respectively, showing a state of the third embodiment before resin sealing.
Figure 8B:
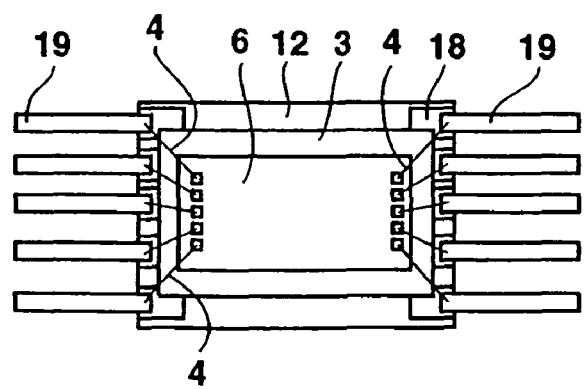

FIG. 7 is a sectional view showing a third embodiment of the invention. FIGS. 8A and 8B are a sectional view and a bottom view, respectively, showing a state of this embodiment before resin sealing.

In those figures, reference numeral 3 denotes a solid-state imaging device; 29, electrodes formed on a peripheral portion of the front face of the solid-state imaging device 3; and 6, a bare IC bonded to the back face of the solid-state imaging device 3 with an adhesive 16. The bare IC 6 incorporates the above-mentioned circuits as the peripheral circuits of the solid-state imaging device 3. In this manner, in this embodiment, the bare IC 6 as the peripheral circuits is directly bonded to the back face of the solid-state imaging device 3, i.e., without any circuit board interposed in between.

A lens fixing member (fixing leg) 12 is made integral with a lens 13 by bonding or two-color molding. While the lens 13 is made of a transparent material (a transparent resin, for instance), the lens fixing member 12 is made of a light-shielding material (a black resin, for instance). Metallized electrode films 18 are formed on the bottom face of the lens fixing member 12. The electrodes 29 of the solid-state imaging device 3 and leads 19 are connected to the metallized electrode films 18, whereby a positional relationship among the solid-state imaging device 3/bare IC 6, the lens 13/lens fixing member 14, and the leads 19 are determined temporarily. Wires 4 electrically connect the leads 19 to electrodes of the bare IC 6. Via the wires 4 and the leads 19, the electrodes of the bare IC 6 are electrically connected to a system outside the camera as well as to the electrodes 29 of the solid-state imaging device 3. FIGS. 8A and 8B show a structure so far described.

A sealing resin 17 seals the front face side of the bare IC 6 as the peripheral circuits, the leads 19, the wires 4, and a bottom portion of the lens fixing member 12 and constitutes a package. A case 8 has an aperture 14 at its top central portion, and the aperture 14 is closed by an infrared-cutting filter 15. The bottom end of the case 8 is bonded to a top peripheral portion of the sealing resin 17 as the package. This is a completed state of a camera.

Figure 9A:
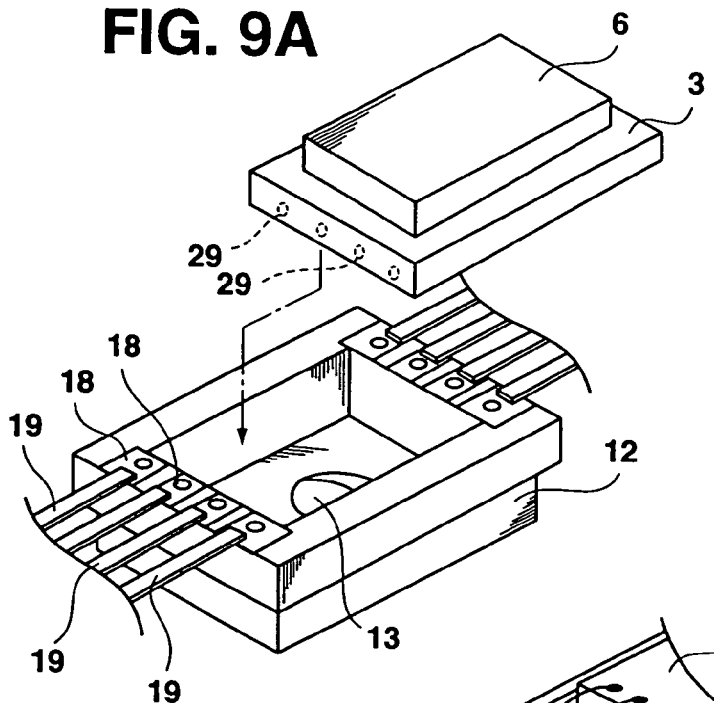
Figure 9B:
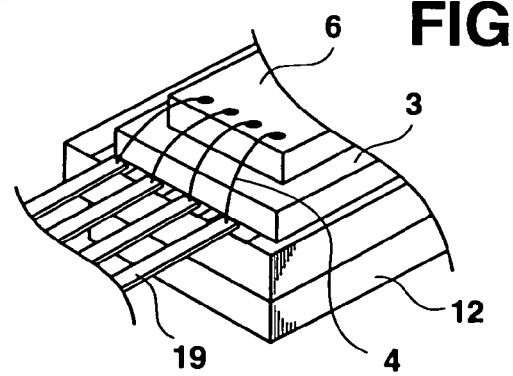
Figure 9C:
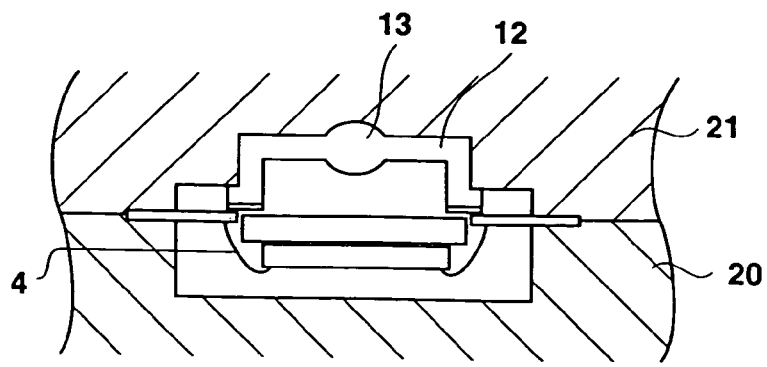

FIGS. 9A-9C show steps of a manufacturing method of the camera shown in FIGS. 7 and 8A-8B. FIG. 9A is a perspective view showing a state that the solid-state imaging device 3 and the bare IC 6 that are bonded to each other are being attached to the lens fixing member 12/lens 13 structure that is faced down. FIG. 9B shows a state after wire bonding. FIG. 9C is a sectional view showing a state of mold clamping for resin sealing.

A bonded structure of the solid-state imaging device 3 and the bare IC 6 and a structure in which the leads 19 are connected in advance to the metallized electrode films 18 on the bottom face of the lens fixing member 12 are prepared. As shown in FIG. 9A, the solid-state imaging device 3 is faced to the lend fixing member 12 so that the respective electrodes 29 of the solid-state imaging device 3 are aligned with the connecting portions of the corresponding metallized electrode films 18. Then, the respective electrodes 29 of the solid-state imaging device 3 are connected to the metallized electrode films 18.

Thereafter, as shown in FIG. 9B, the leads 19 are connected to the electrodes of the bare IC 6 with the wires 4; that is, wire bonding is performed. Sealing is then performed by molding by using molds (a lower mold 20 and an upper mold 21) shown in FIG. 9C. Finally, the case 8 is attached to complete the camera shown in FIG. 7.

This embodiment can also provide a very small, inexpensive camera.

Figure 10:
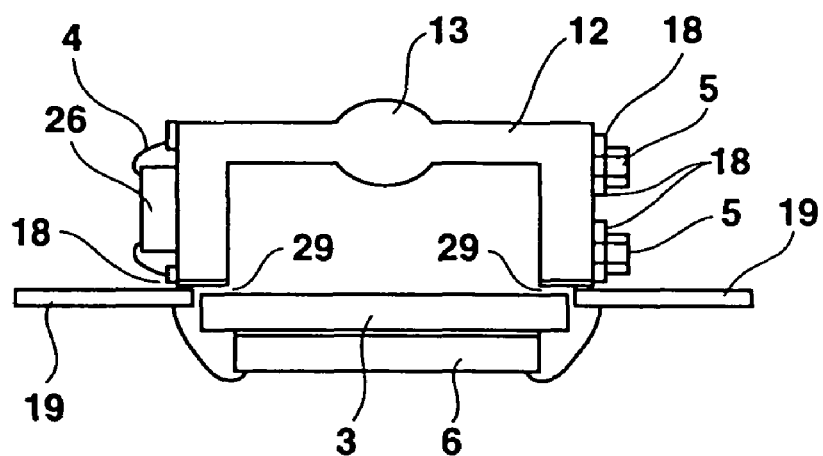
FIG. 10 is a sectional view showing an example as a modification of the third embodiment.

FIG. 10 is a sectional view showing the main part of another example of the camera shown in FIG. 7.

In this example, metallized electrode films 18 as a wiring are formed on the outer side faces of the lens fixing member 12, and chip parts 5 and a bare IC 26 that is different from the bare IC 6 bonded to the solid-state imaging device 3 (the chip parts 5 and the bare IC constitute peripheral circuits) are mounted on the same outer faces. Respective electrodes of the bare IC 26 are connected to the metallized electrode films 18 with wires 4.

This configuration can reduce the size and the price of a camera that is higher in performance.

Embodiment 4

Figure 11:
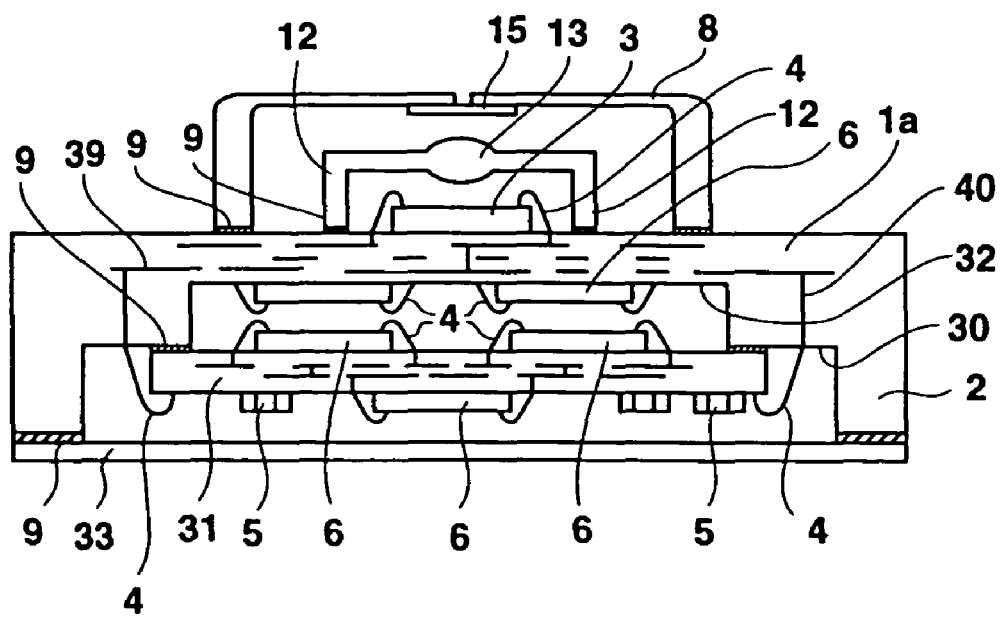
FIG. 11 is a sectional view showing a fourth embodiment of the invention.

FIG. 11 is a sectional view showing a solid-state imaging apparatus according to a fourth embodiment of the invention. In this embodiment, a ceramic package 1a having a multi-stage, multilayered wiring structure is used as a circuit board. A solid-state imaging device 3 and a lens 13 are mounted on the outer surface of the ceramic package 1a, and are isolated from the external environment by a case 8. A number of ICs 6 and discrete parts 5 are mounted on the inner surface side of the ceramic package 1a.

Reference numeral 30 denotes a step of the ceramic package 1a having a multi-stage, multilayered wiring structure. A plate-like, multilayered wiring board 31 is bonded to a peripheral portion of the step 30, and the ICs 6 and the chip parts 5 are mounted on both surfaces of the circuit board 30. Electrical connections between the plate-like multilayered wiring board 31 and the ceramic circuit package 1a are established by connection wires 4. ICs 6 are also mounted on an inner surface 32 of the ceramic package 1a. A peripheral portion of a back lid 33 is bonded to a peripheral wall 2 of the ceramic package 1a to seal the inside space. Reference numerals 39 and 40 denote wiring films and through-holes, respectively.

In the above solid-state imaging apparatus, the solid-state imaging device 3 and the lens 13 are provided on the outer surface of the package 1a having a multi-stage, multilayered wiring structure and the ICs 6 as peripheral circuits are provided on its inner surface. Further, the plate-like multilayered wiring board 31 is fixed to the step 30 of the package 1a, and the ICs 6 and the discrete parts 5 are provided on both surfaces of the wiring board 31. Since electrical connections that are necessary between the solid-state imaging device 3 and the ICs 6 can be established by the wirings of the package 1a and the wiring board 31, the solid-state imaging device 3 and the ICs 6 and other parts as the peripheral circuits can be mounted at a higher integration density.

Figure 12:
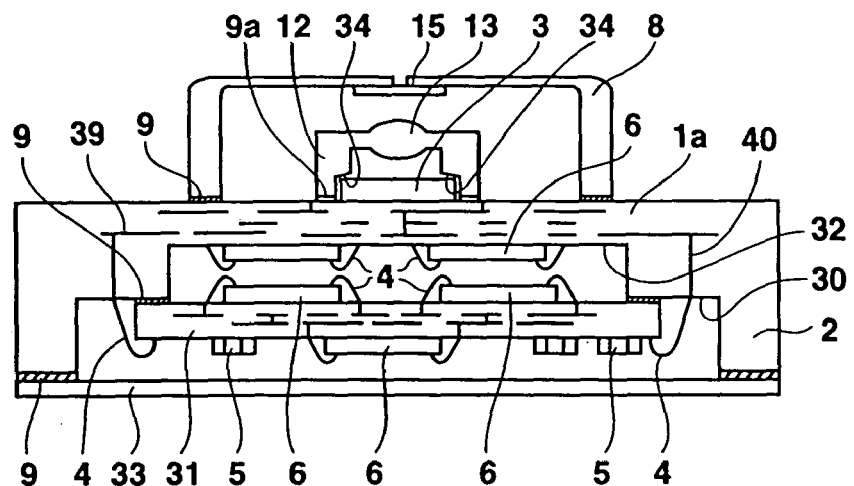
FIG. 12 is a sectional view showing an example as a first modification of the fourth embodiment of FIG. 11.

FIG. 12 is a sectional view showing an example as a first modification of the fourth embodiment shown in FIG. 11. In this example, the lens fixing member (leg) 12 is integral with the lens 13 and the inner face of the lens fixing member 12 is formed with positioning slant faces 34. As a result, the positional relationship between the lens 13 and the solid-state imaging device 3 is automatically defined by self-alignment by bringing the slant faces 34 into contact with the top face edges of the solid-state imaging device 3. Therefore, a positioning operation can be performed easily and correctly.

More specifically, positioning is performed by bringing the top face edges of the solid-state imaging device 3 into line contact with the positioning slant faces 13 of the lens fixing member 12 in a state that the bottom face of the lens fixing member 12 is temporarily bonded to the front surface of the circuit board 1a with a half-curable resin (an ultraviolet-curing resin, for instance) 9a. Thereafter, a fully bonded state is established by completely curing the resin 9a by illuminating it with ultraviolet light. The other points are the same as in the embodiment of FIG. 11.

Figure 13:
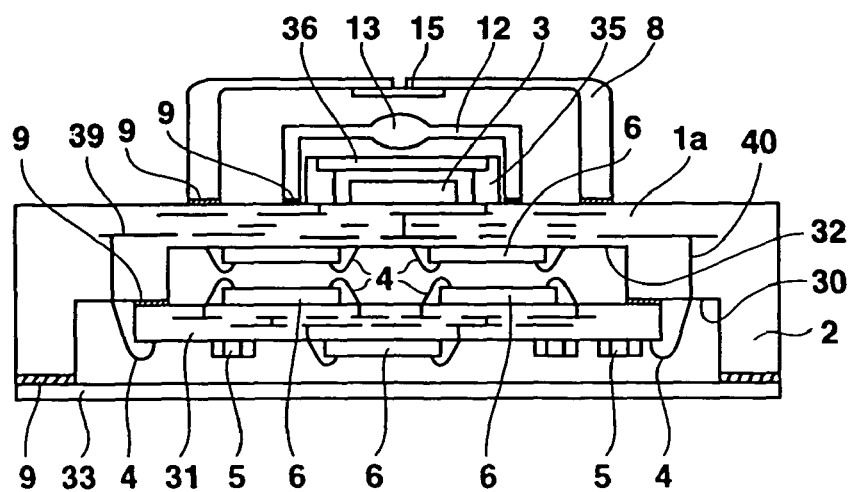
FIG. 13 is a sectional view showing an example as a second modification of the fourth embodiment of FIG. 11.

FIG. 13 is a sectional view showing an example as a second modification of the fourth embodiment shown in FIG. 11. In this example, the solid-state imaging device 3 is covered with a glass and the lens 13 is disposed outside the glass. As shown in FIG. 13, a glass supporting rectangular frame 35 surrounds the solid-state imaging device 3, and a glass plate 36 is fixed to a step that is formed in a top inside portion of the rectangular frame 35. The lens 13 is disposed outside the glass plate 36 and the rectangular frame 35 and inside the case 8. The other points are the same as in the embodiment of FIG. 11.

Figure 14:
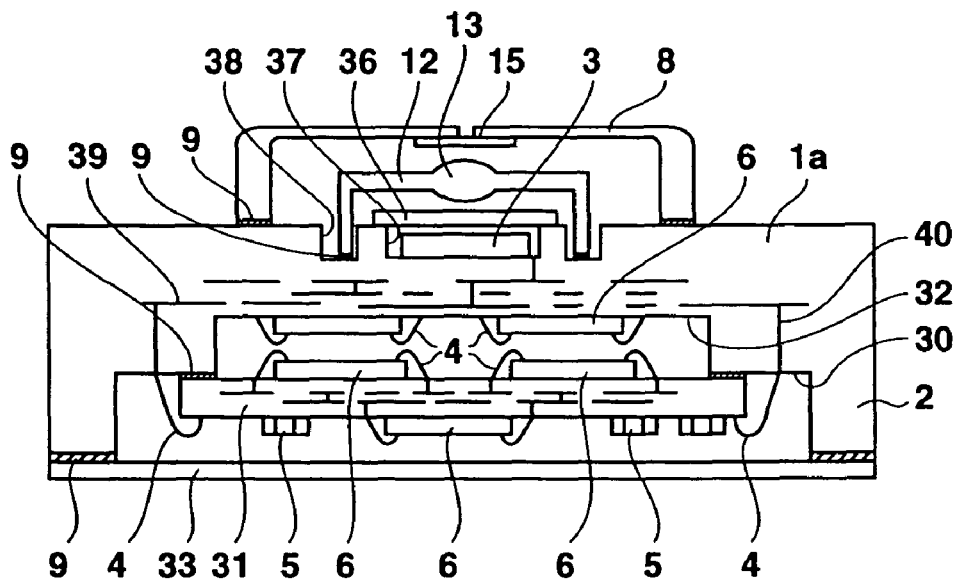
FIG. 14 is a sectional view showing an example as a third modification of the fourth embodiment of FIG. 11.

FIG. 14 is a sectional view showing an example as a third modification of the fourth embodiment shown in FIG. 11. In this example, the outer surface of the circuit board 1a is formed with a solid-state-imaging-device-mounting recess 37. The solid-state imaging device 3 is accommodated in the recess 37, and the recess is covered with a glass plate 36. Further, a lens-fixing recess 38 is formed outside the recess 37, and the fixing member (leg) 12 of the lens 13 is fixed to the recess 38. The other points are the same as in the embodiment of FIG. 11.

Figure 15:
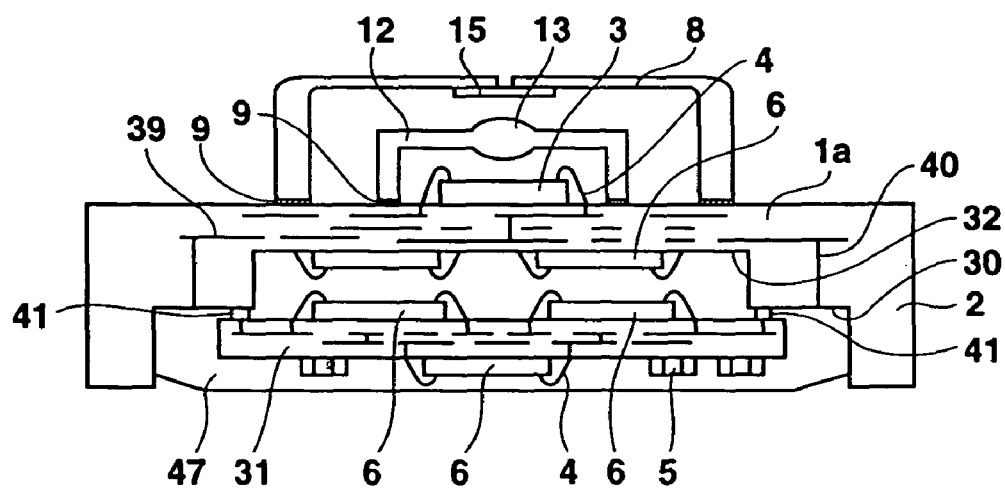
FIG. 15 is a sectional view showing an example as a fourth modification of the fourth embodiment of FIG. 11.

FIG. 15 is a sectional view showing an example as a fourth modification of the fourth embodiment shown in FIG. 11. In this example, connections between the wiring board 31 and (the step 31 of) the circuit board 1a having a multi-stage, multilayered wiring structure are established by bumps 41 rather than wires. The bottom surface of the wiring board 31 is protected by a resin 7. The other points are the same as in the embodiment of FIG. 11.

Figure 16:
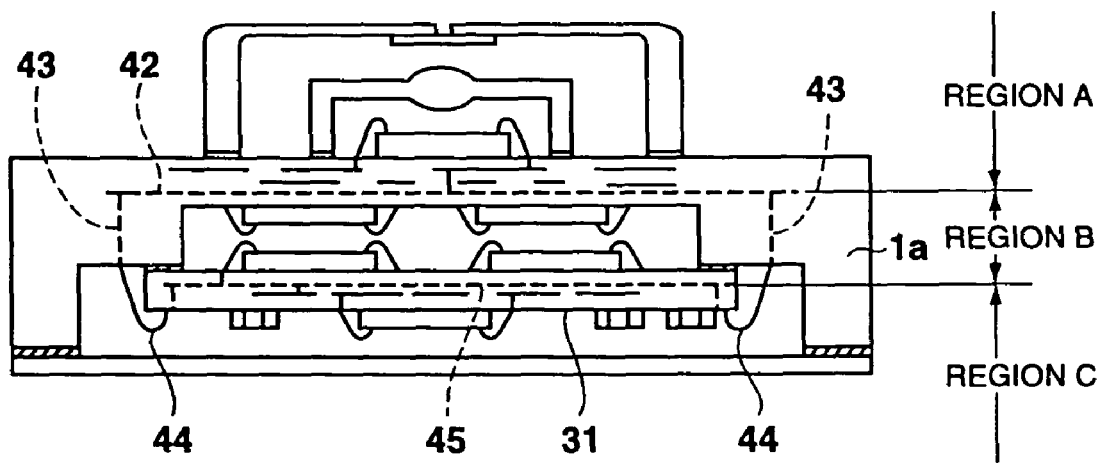
FIG. 16 is a sectional view showing an example as a fifth modification of the fourth embodiment of FIG. 11.

FIG. 16 is a sectional view showing an example as a fifth modification of the fourth embodiment shown in FIG. 11. This example is so constructed that region B can be electro-statically shielded from regions A and C. A shield wiring film 42 is formed in the circuit board 1a having a multi-stage, multilayered wiring structure so as to be wide enough to cover regions A and B. Shield through-holes 43 are connected to the wiring film 42. Reference numerals 44 and 45 are connection wires and a shield wiring film formed in the plate-like, multilayered wiring board 31. Region B is electrostatically shielded from regions A and B by a loop consisting of the shield wiring film 42, the through-hole 43, the connection wire 44, the shield wiring film 45, the connection wire 44, and the through-hole 43.

Therefore, noise generated in region B can be prevented from entering regions B or C, and vice versa.

In this example, an analog circuit section and a digital circuit section can be electrically isolated from each other, for instance, by providing the digital circuit section and the analog circuit section in region B and regions A and C, respectively. Naturally, the roles of regions A, B, and C may assume various forms depending on the number of ICs and signal flows and hence are not limited to those in the above example.

Embodiment 5

Figure 17:
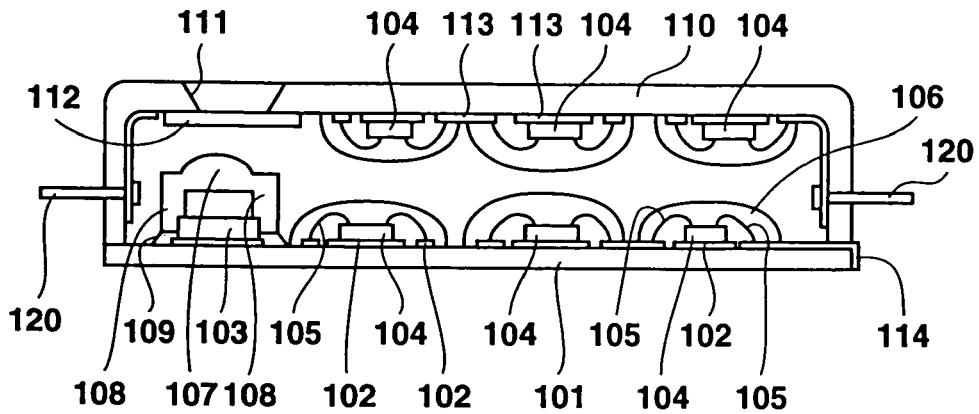
FIG. 17 is a sectional view of a camera according to a fifth embodiment of the invention.

FIG. 17 is a sectional view schematically showing a camera according to a fifth embodiment of the invention.

In FIG. 17, reference numeral 101 denotes a wiring board. Wiring films 102 are formed on one surface of the wiring board 101. A solid-state imaging device 103 is mounted on the same surface of the wiring board 101. IC chips 104 are also mounted on the same surface of the wiring board 101 as the solid-state imaging device 103 is mounted. Bonding wires 105 connects electrodes of the IC chips 104 to the wiring films 102. Resins 106 formed by potting seal the respective IC chips 104. Although not shown in FIG. 17, electronic parts other than an IC chip such as a capacitor and a quartz oscillator may also be mounted on the surface of the wiring board 101. Part of the wiring films 102 formed on the wiring board 101 which part are to be connected to an external system are extended to an outside surface. Extended portions 114 of the wiring films 102 serve as external terminals to be connected to the external system.

Reference numeral 107 denotes a lens. Fixing legs 108 are joined to the lens 107 by integral molding that makes full use of two-color molding, or by bonding together separately formed parts. The fixing legs 108 is bonded to the wiring board 101 with an adhesive 109 while being positioned so that the lens 107 can form an object image on the solid-state imaging device 103.

A light-shielding case 110 has an opening (aperture) 111. The opening 111 is closed by an optical filter (infrared-cutting filter) 112. The bottom end face of the light-shielding case 110 is bonded to a peripheral portion of the wiring board 101. Wiring films 113 are formed on the inner surface of the light-shielding case 110, and IC chips 104 are mounted on the ceiling portion of the case 110. It goes without saying that electronic parts other than an IC chip such as a capacitor and a quartz oscillator may also be mounted on the ceiling portion of the light-shielding case 110.

Reference numeral 120 denotes external terminals formed through side walls of the light-shielding case 110 which external terminals are portions, to be connected to an external system, of the wiring films 113 that are formed on the inner surface of the light-shielding case 110. The external terminals 120 are so formed as to penetrate through the respective side walls of the light-shielding case 110 and portions of the wiring films 113 which are extended to the inner surfaces of the side walls of the light-shielding case 110. The external terminals 120 are electrically connected to the extended portions of the respective wiring films 113 with solder, for instance.

Figure 18:
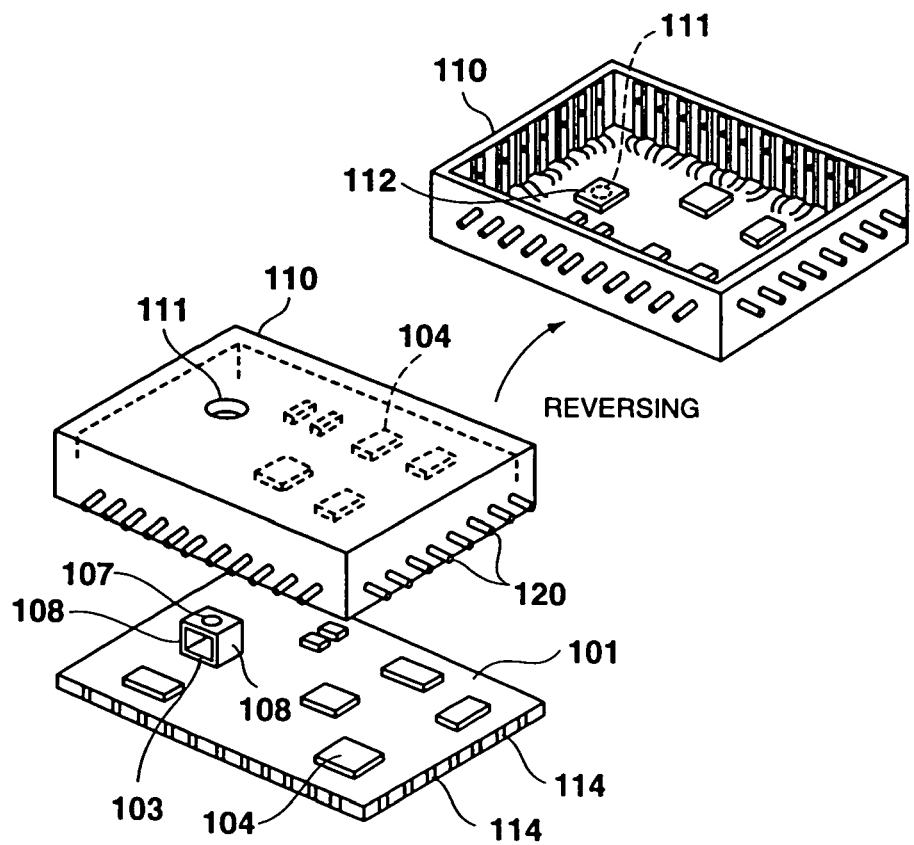
FIG. 18 is an exploded perspective view for facilitating understanding of the camera of FIG. 17.

FIG. 18 is an exploded perspective view for facilitating understanding of the fifth embodiment shown in FIG. 17.

In the camera, since the IC chips 104 (and other electronic parts) as peripheral circuits of the solid-state imaging device 103 are disposed on the inner surface of the light-shielding case 110, the inside space formed by the wiring board 101 and the light-shielding case 110 can be utilized effectively. Therefore, the camera can be miniaturized even if it incorporates a number of peripheral circuits.

The inside of the light-shielding case 110 is recessed. A wiring can easily be formed in such a recess by preparing a flexible wiring board and bonding it to the inner surface of the light-shielding case 110.

Wiring layers may directly be formed on the inner surface of the light-shielding case 110. However, in this case, a relatively high level of technique is needed to form wiring films on the inner surfaces of the side walls (which are perpendicular to the surface of the light-shielding case 110 which becomes a ceiling surface when the light-shielding case 110 is bonded to the wiring board 101) of the light-shielding case 110, because it is relatively difficult to expose the inner surfaces of the side walls in contrast to the fact that the ceiling surface can be exposed easily.

Embodiment 6

Figure 19A:
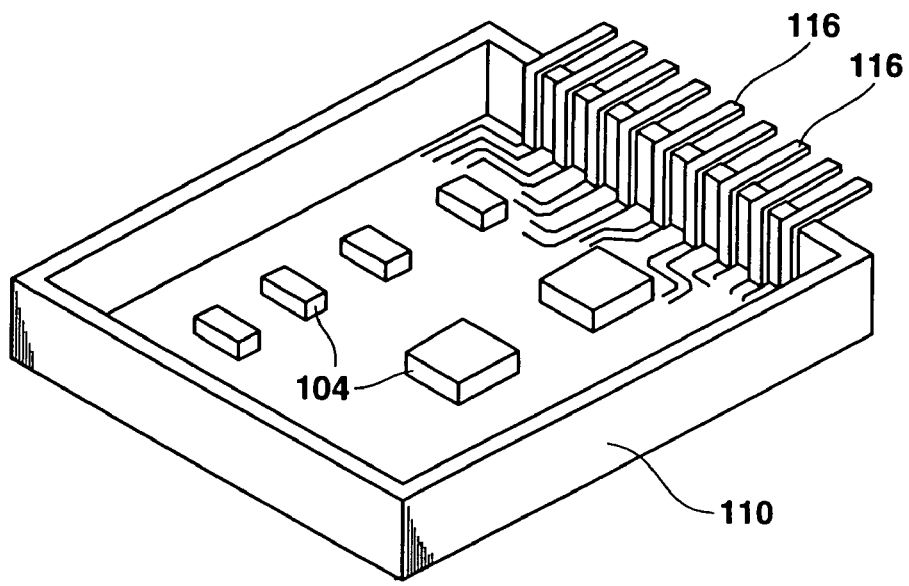
Figure 19B:
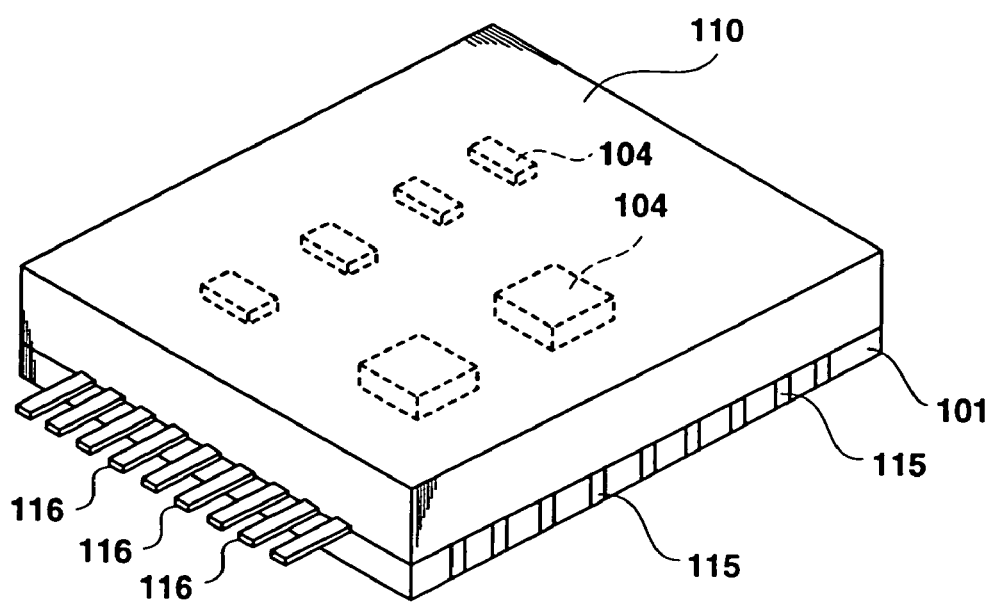

In view of the above, according to a sixth embodiment of the invention, instead of forming wiring films on the inner surfaces of the side walls of the light-shielding case 110, electrical connections to an external system is effected by directly connecting external terminals to wiring films formed on the ceiling surface of the light-shielding case 110. FIGS. 19A and 19B show a camera having such a configuration. FIG. 19A is a perspective view in which the light-shielding case 110 is shown upside down (for convenience of description, FIG. 19A shows a state that the IC chips 104 are not subjected to wire bonding or potting), and FIG. 19B is a perspective view of the camera. In those figures, reference numerals 116 denotes external terminals.

Embodiment 7

Figure 20A:
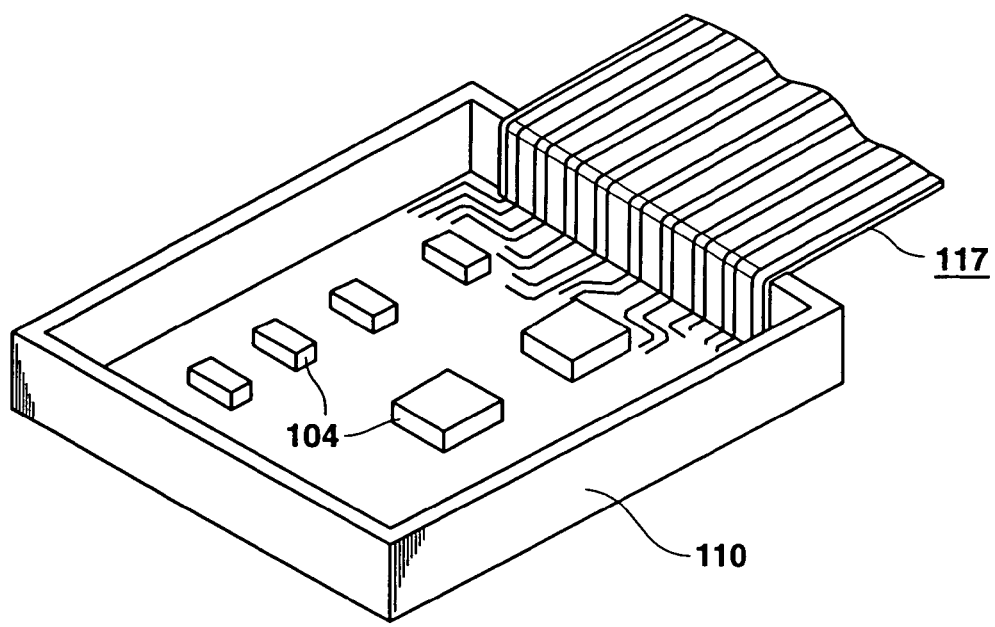
Figure 20B:
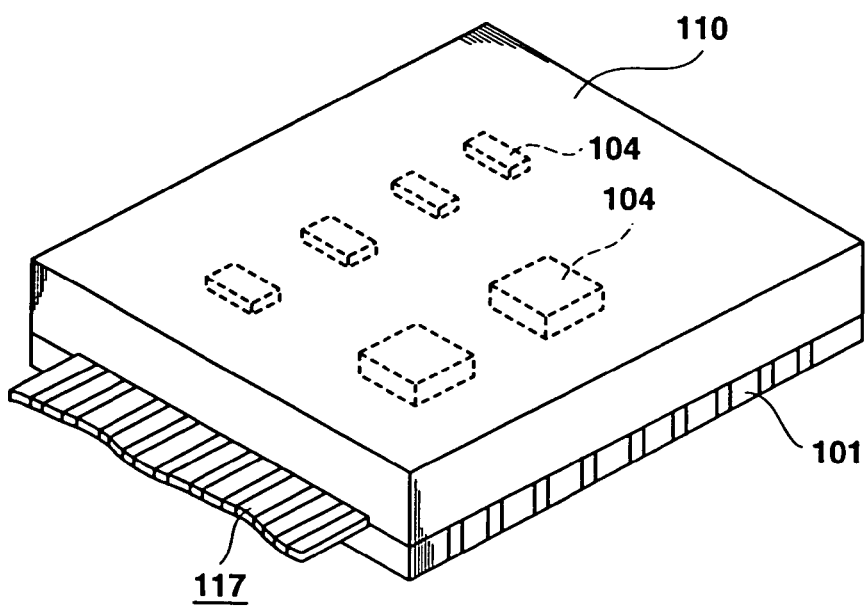

According to a seventh embodiment of the invention, a flexible wiring board is used instead of the external terminals 116 of the sixth embodiment. FIGS. 20A and 20B show a camera having such a configuration. FIG. 20A is a perspective view in which the light-shielding case 110 is shown upside down (for convenience of description, FIG. 20A shows a state that the IC chips 104 are not subjected to wire bonding or potting), and FIG. 20B is a perspective view of the camera. In those figures, reference numerals 117 denotes a flexible wiring board.

Although it is relatively difficult to expose the inner surfaces of the side walls (which are perpendicular to the surface of the light-shielding case 110 which becomes a ceiling surface when the light-shielding case 110 is bonded to the wiring board 101) of the light-shielding case 110, the exposure becomes less difficult if the angle formed by each side wall and the ceiling surface is made larger than 90°, i.e., is made an obtuse angle. The exposure is relatively easy if the above angle is set at about 135°, for instance. In such a case, wiring films may be formed on the inner surface of the light-shielding case 110.

Although in the fifth to seventh embodiments the imaging lens 107 is attached to the wiring board 101, the invention is not limited to such a case; it goes without saying that the lens 107 may be attached to the light-shielding case 110. IC chips (and other electronic parts) may also be mounted on the inner surfaces of the side walls of the light-shielding case 110. Further, a camera of a type having more peripheral circuits can be miniaturized by disposing IC chips also on the back surface of the wiring board 101. In this manner, the invention can be practiced in various forms.

Embodiment 8

Figure 21:
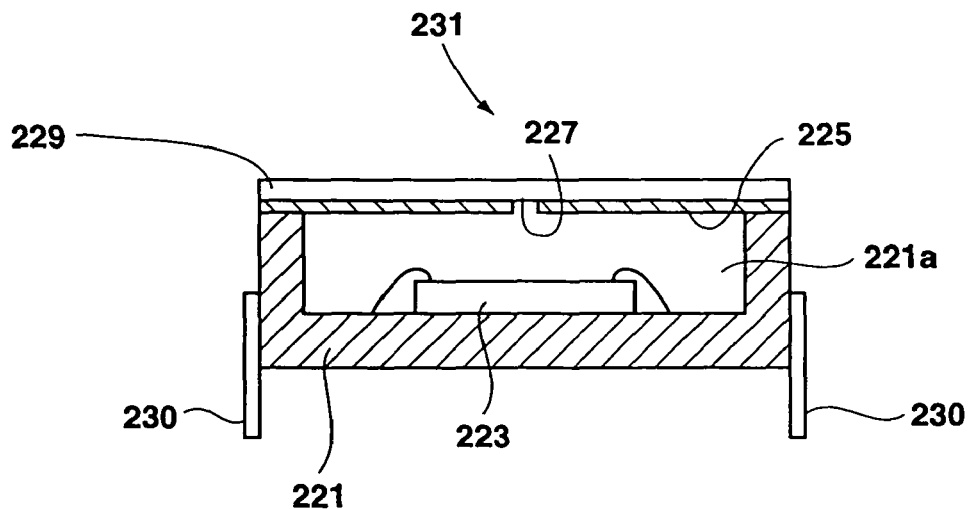
FIG. 21 is a sectional view of a solid-state imaging apparatus according to an eighth embodiment of the invention.

FIG. 21 is a sectional view of a solid-state imaging apparatus according to an eighth embodiment of the invention. A package 221 accommodates an imaging device (CCD) 223 to protect it from the external environment. The package 221 is formed with an opening, which is closed by a light-shielding member 225. The light-shielding member 225 is formed with a pinhole 227, which is opposed to the imaging face of an imaging device 223. A package cover glass 229 is disposed on the light-shielding member 225 to protect the imaging device 223. Leads 230 for leading out an electrical signal from the imaging device 223 are extended from the package 221.

The pinhole 227 is an extremely small hole having a diameter of several tens of microns to several hundred microns and allowing passage of light. The combination of the light-shielding member 225 and the package cover glass 229 may be constructed in the following manner. For example, a metal evaporation film is formed on a glass plate and then patterned to have the pinhole 227. Alternatively, a printed film, a plastic plate, or the like that is formed with the pinhole 227 is bonded to a glass plate.

Figure 22:
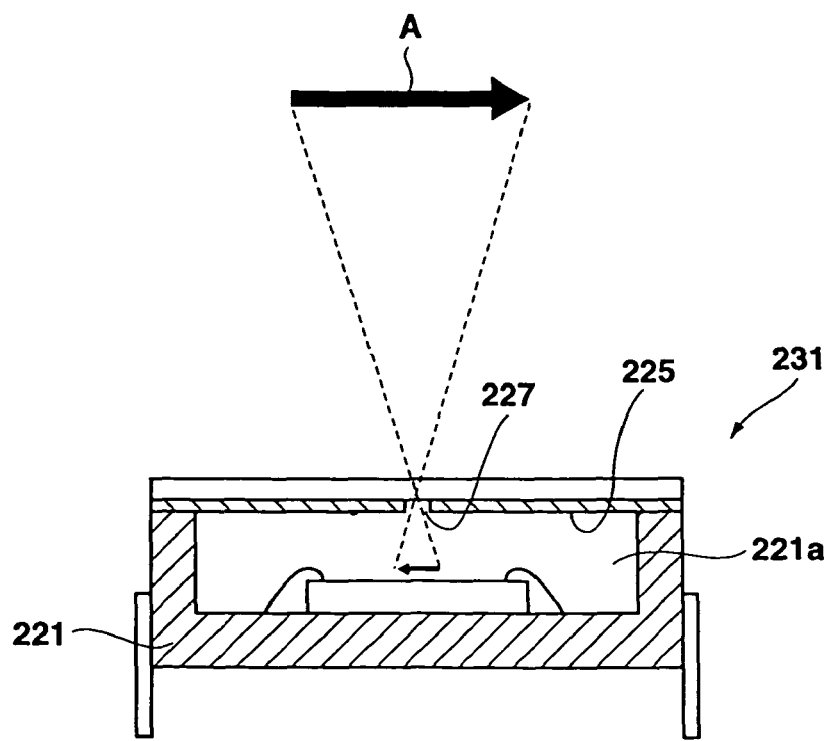
FIG. 22 is a sectional view illustrating the operation of the solid-state imaging apparatus of FIG. 21.

FIG. 22 is a sectional view illustrating the operation of the solid-state imaging apparatus according to this embodiment.

In the solid-state imaging apparatus 231 having the above configuration, the opening of the package 221 is closed by the light-shielding member 225, whereby the inside of the package 221 becomes a dark space 221a. On the other hand, light can be introduced from the outside into the dark space 221a through the pinhole 227 that is formed through the light-shielding member 225. Imaging light from an imaging object A which is introduced through the pinhole 227 is imaged on the imaging face of the imaging device 223 by the image forming action of the pinhole 227. That is, the solid-state imaging apparatus 231 enables image formation of imaging light by using the pinhole 227 instead of a lens, i.e., by utilizing the principle of operation of a pinhole camera.

Figure 1:
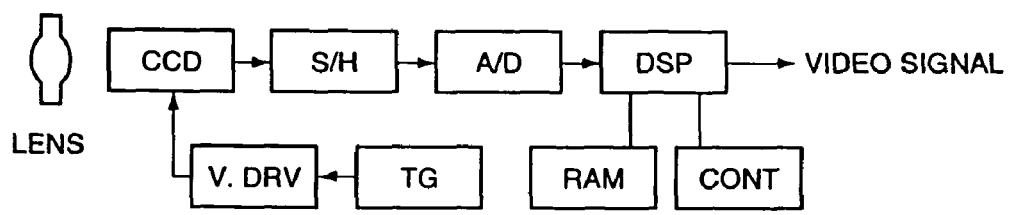
FIG. 1 is a block diagram showing a general configuration of a solid-state imaging apparatus.
Figure 2:
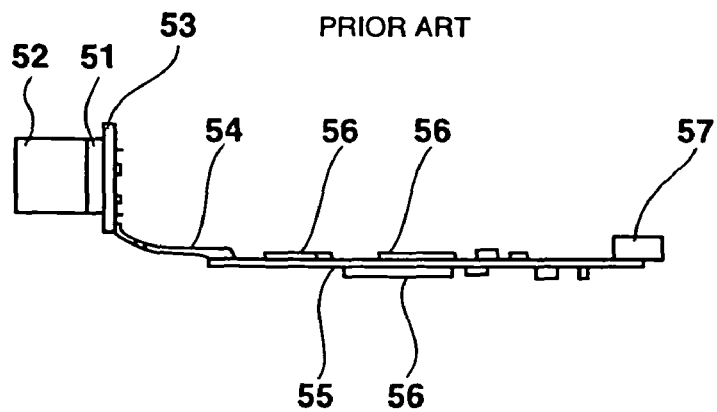
FIG. 2 shows the configuration of a conventional solid-state imaging apparatus.
Figure 3:
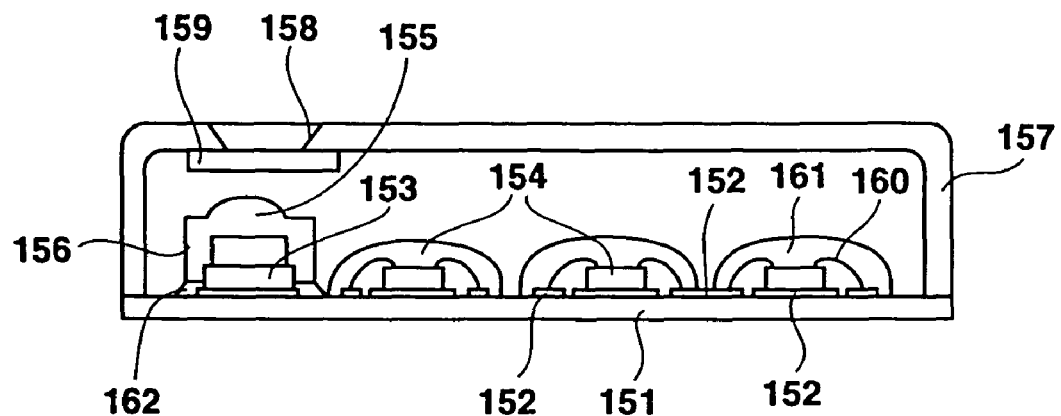
FIG. 3 is a sectional view of a conventional camera.
Figure 4:
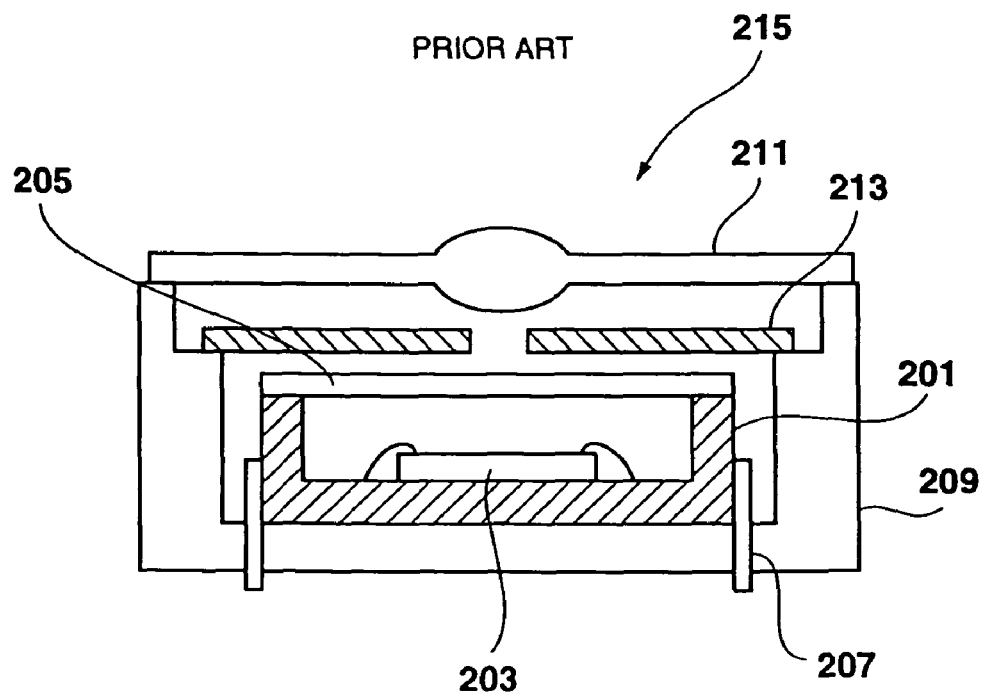
FIG. 4 is a sectional view of another conventional camera.

Since the solid-state imaging apparatus 231 enables image formation of imaging light by using the pinhole 227 instead of a lens, it can eliminate a lens and a lens stop that are conventionally necessary to form an image of imaging light. Therefore, the number of parts can be reduced and the apparatus structure can be simplified. In the conventional apparatus, to mount the lens 211 and the lens stop 213, the package 201 (see FIG. 4) is accommodated in the case 209 and the lens and the lens stop are attached to the case 209. In contrast, in the solid-state imaging apparatus 231 of this embodiment, since the lens and the lens stop can be eliminated, the case 209 is not necessary either. Thus, a large degree of miniaturization is possible.

Further, since image formation is enabled by the simple configuration in which the light-shielding member 225 formed with the pinhole 227 is fixed to the package 221, the performance of the apparatus is not affected by deviations of such parts as a lens, a lens stop, and the imaging device 223 and hence the handling of the apparatus can be made easier. This is in contrast to the fact that in the conventional configuration the lens 211, the lens stop 213, and the imaging device 203 should be held on the optical axis with high accuracy.

Embodiment 9

Figure 23:
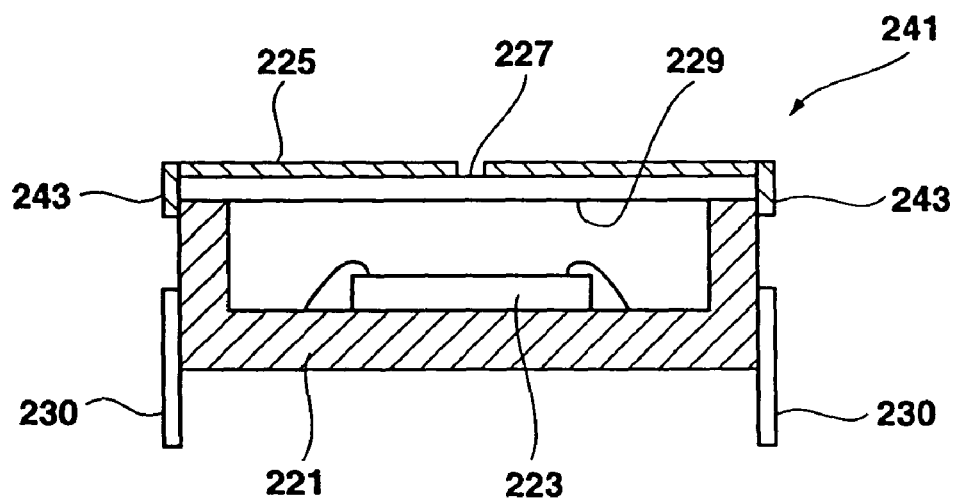
FIG. 23 is a sectional view of a solid-state imaging apparatus according to a ninth embodiment of the invention.

A solid-state imaging apparatus according to a ninth embodiment of the invention will be described with reference to a sectional view of FIG. 23. In a solid-state imaging apparatus 241 according to this embodiment, a package cover glass 229 is attached to an opening of a package 221 and a light-shielding member 225 is placed on the outer surface of the package cover glass 229. Light-shielding members 243 are attached to the end faces of the package cover glass 229 to prevent passage of incident light through the end faces of the package cover glass 229. The other part of the configuration is the same as in the solid-state imaging apparatus 231 of the eighth embodiment.

Since imaging light introduced through the pinhole 227 is imaged on the imaging face of the imaging device 223 by using the pinhole 227 instead of a lens, the solid-state imaging apparatus 241 according to the second embodiment is simple in configuration and can be handled easily like the above-described solid-state imaging apparatus 231. In addition, since the surfaces of the package cover glass 229 is covered with the light-shielding members 225 and 243, light incident on the package cover glass 229 from the portions (for instance, the end faces of the package cover glass 229) other than the pinhole 227 can be interrupted, whereby imaging light receive any external disturbance.

Embodiment 10

Figure 24:
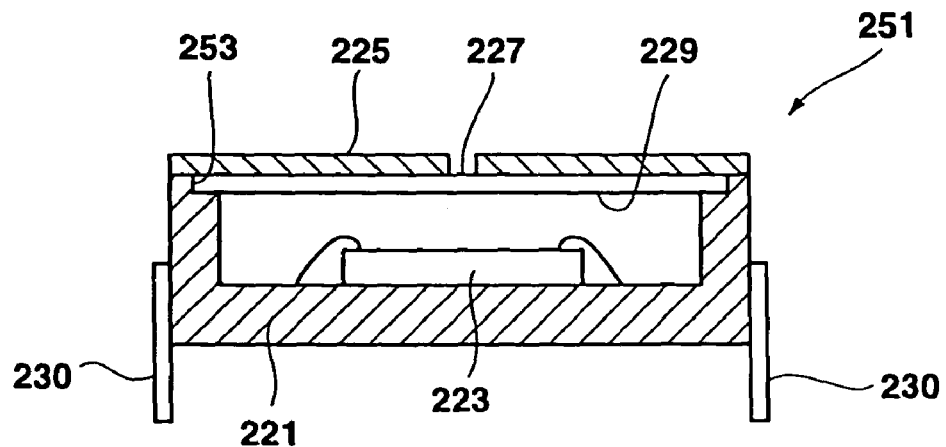
FIG. 24 is a sectional view of a solid-state imaging apparatus according to a tenth embodiment of the invention.

A solid-state imaging apparatus according to a tenth embodiment of the invention will be described with reference to a sectional view of FIG. 24. In a solid-state imaging apparatus 251 according to this embodiment, a package 221 is formed with a step 253 in its opening inner periphery. The end faces of a package cover glass 229 is fixed to the step 253 so as to fit into the latter. A light-shielding member 225 is attached to the outer surface of the package cover glass 229 that is fixed to the opening. The other part of the configuration is the same as in the solid-state imaging apparatus 241 of the ninth embodiment.

Since imaging light introduced through the pinhole 227 is imaged on the imaging face of the imaging device 223 by using the pinhole 227 instead of a lens, the solid-state imaging apparatus 251 according to the tenth embodiment is simple in configuration and can be handled easily and imaging light receive any external disturbance as in the case of the above-described solid-state imaging apparatus 241. In addition, since the end faces of the package cover glass 229 are fixed to the step 253 so as to fit into the latter, the interruption of light that would otherwise reach the end faces of the package cover glass 229 and the fixing of the package cover glass 229 are effected at the same time in a reliable manner.

Embodiment 11

Figure 25:
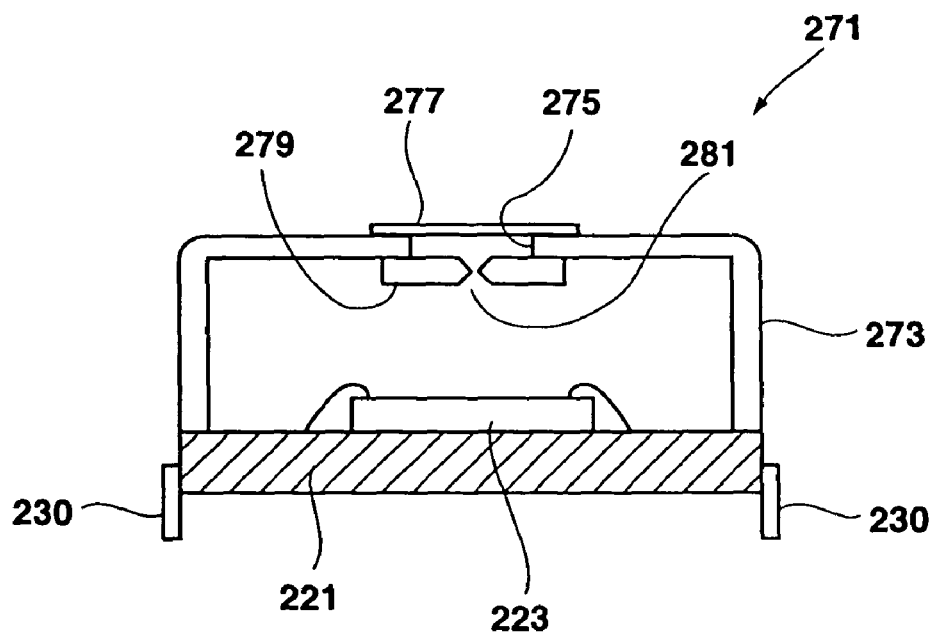
FIG. 25 is a sectional view of a solid-state imaging apparatus according to an eleventh embodiment of the invention.

A solid-state imaging apparatus according to an eleventh embodiment of the invention will be described with reference to a sectional view of FIG. 25. In a solid-state imaging apparatus 271 according to this embodiment, a package 221 mounted with an imaging device 223 is covered with a cover case 273. The cover case 273 is formed with an opening 275 at a portion opposed to the imaging device 223. A cover glass 277, which is a small plate, is attached to the outer surface of the cover case 273 so as to close the opening 275. A light-shielding member 279 formed with a pinhole 281 at its center is attached to the inner surface of the cover case 273 so as to be associated with the opening 275. That is, in the solid-state imaging apparatus 271, the cover glass 277 and the light-shielding member 279 are separately provided.

The solid-state imaging apparatus 271 according to the eleventh embodiment is simple in configuration and can be handled easily like the above-described solid-state imaging apparatus 231. Since the imaging device 223 is covered with the cover case 273, the dark space can be formed easily. Further, since the cover glass 277 and the light-shielding member 279 are provided in association with only the opening 275 that is formed in the cover case 273, they can be made small and the degree of freedom in selecting materials therefor can be increased.

Embodiment 12

Figure 26:
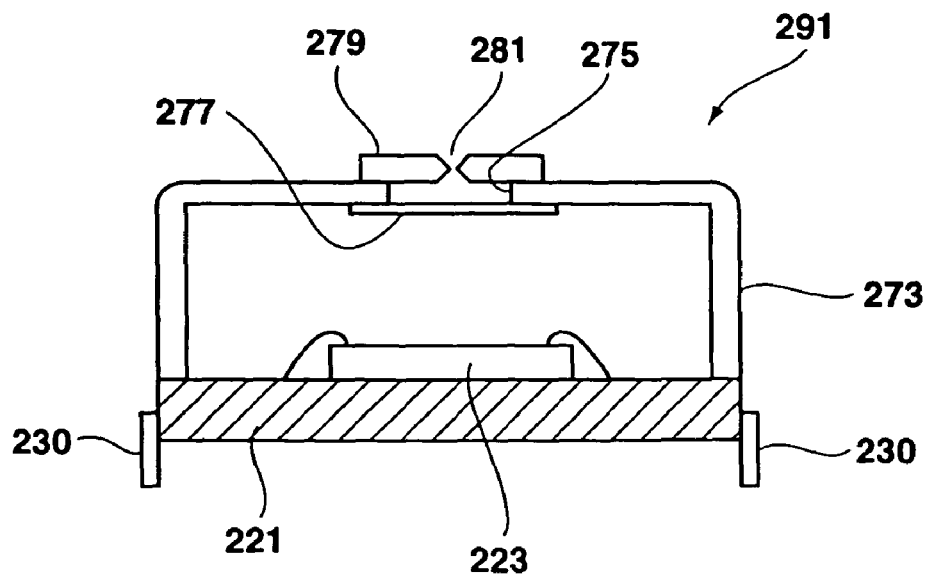
FIG. 26 is a sectional view of a solid-state imaging apparatus according to a twelfth embodiment of the invention.

A solid-state imaging apparatus according to a twelfth embodiment of the invention will be described with reference to a sectional view of FIG. 26. A solid-state imaging apparatus 291 according to this embodiment generally similar in configuration to the solid-state imaging apparatus 271 of the eleventh embodiment, and is different from the latter in that the cover glass 277 and the light-shielding member 279 are disposed at opposite positions.

The solid-state imaging apparatus 291 according to the twelfth embodiment has the same advantages as the above-described solid-state imaging apparatus 271. In addition, since the light-shielding member 279 is attached to the outer surface of the cover case 273, the light-shielding member 279 can be positioned and fixed after the attachment of the cover case 273. As a result, the position of the pinhole 281 can be adjusted easily in assembling the apparatus.

Figure 27A:
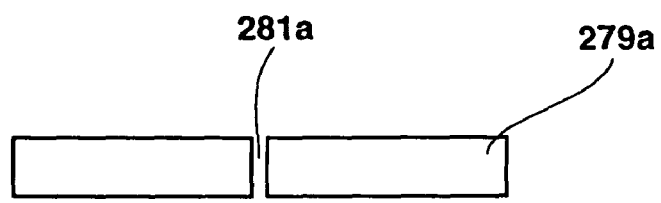
FIGS. 27A-27C are illustrations of examples of a pinhole formed in a light-shielding member.
Figure 27B:
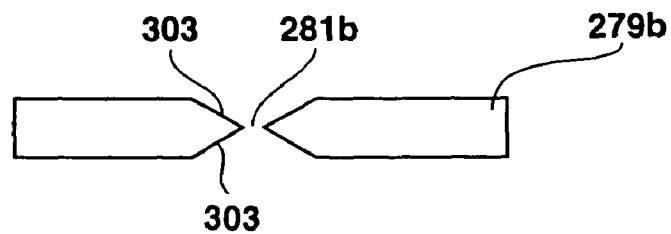
Figure 27C:
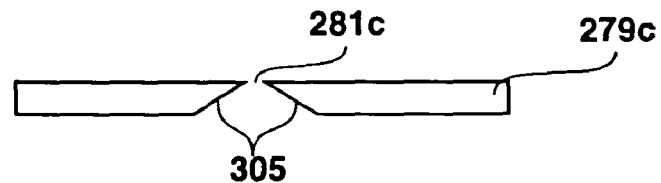

FIGS. 27A-27C illustrate examples of the pinhole formed in the light-shielding member. As shown in FIGS. 27A-27C, the pinhole 281 of the light-shielding member 279 used in the solid-state imaging apparatuses 271 and 291 of the eleventh and twelfth embodiments may have various shapes.

A pinhole 281a shown in FIG. 27A is a very small hole formed through a light-shielding member 279a so as to have a constant inner diameter in the thickness direction of the light-shielding member 279a. According to the light-shielding member 279a, the pinhole 281a can be formed relatively easily.

In the case of a pinhole 281b shown in FIG. 27B, each surface of a light-shielding member 279b is formed with tapered faces 303 on both sides of the pinhole 281b. According to the light-shielding member 279b, there does not occur an event that the exit-side periphery of the pinhole 281 interferes with light that, after entering the pinhole 281, exits the pinhole 281 toward the imaging device 223. Therefore, a phenomenon that incident light is interrupted by the hole periphery (what is called an eclipse) can be prevented, so that a difference in brightness on the imaging face can be reduced.

In the case of a pinhole 281c shown in FIG. 27C, the back surface of a light-shielding member 279c is formed with tapered faces 305 on both sides of the pinhole 281c. The light-shielding member 279c provides the same advantages as the light-shielding member 279b of FIG. 27B. In addition, since only the back surface of the light-shielding member 279c is formed with the tapered faces 305, the light-shielding member 279c can be formed more easily.

It is noted that the configurations of the first to seventh embodiments can also be applied to a pinhole-type solid-state imaging apparatus.

What is claimed is:

1. A solid-state imaging apparatus comprising:
    a first package having a multilayered wiring structure and a step;
    a solid-state imaging device mounted on an outer surface side of the first package;
    one or a plurality of bare ICs disposed on an inner surface side of the first package and serving as a peripheral circuit or circuits of the solid-state imaging device;
    a second package having a multilayered wiring structure electrically connected to the multilayer wiring structure of the first package via a through hole in the step of the first package; and
    another one or a plurality of bare ICs disposed on one or both surfaces of the second package,
    wherein,
        the step is a region raised above the inner surface side of the first package,
        the one or plurality of bare ICs is electrically connected to the solid-state imaging device via the multilayer wiring structures of the first and second packages.

2. The solid-state imaging apparatus according to claim 1, further comprising:
    a light-shielding case having an aperture for limiting light that comes from an outside of the solid-state imaging apparatus and traveling toward a front face of the solid-state imaging device; and
    a lens disposed inside the light-shielding case for forming an object on the front face of the solid-state imaging device that is carried by light passing through the aperture.

3. An imaging apparatus comprising:
    a first package including a step;
    a solid-state imaging device disposed on a surface of the first package;
    one or more plurality of ICs are disposed on an inner surface of the first package;
    a second package fixed to the step of the first package;
    one or a plurality of ICs disposed on a surface of the second package,
    wherein,
        the step is a region raised above the inner surface of the first package,
        first package and the second package are electrically connected via a through hole in the step of the first package.

4. The imaging apparatus of claim 3 wherein, the one or plurality of ICs are disposed on both surfaces of the second package.

5. The imaging apparatus of claim 3 further comprising a lens on the outer service of the solid-state imaging device.

6. The imaging apparatus of claim 3 further comprising a light-shielding case having an aperture for limiting light that comes from an outside of the imaging apparatus and traveling toward a front face of the solid-state imaging device.

7. An imaging apparatus comprising:
    a first substrate including an imaging element;
    a second substrate including a peripheral circuit for processing an imaging signal of the imaging element;
    wherein,
        the second substrate attaches to a step on the first substrate, the step being a region raised above a surface of the first substrate package and
        a first package and a second package are electrically connected via
        a through hole in the step on the first substrate:
        one or more plurality of ICs are disposed on an inner surface of the first package.

8. The imaging apparatus of claim 7 further comprising a lens on the outer service of the imaging element.

9. The imaging apparatus of claim 7 further comprising a light-shielding case having an aperture for limiting light that comes from an outside of the imaging apparatus and traveling toward a front face of the imaging element.

* * * * *